United States Patent
Anderson et al.

(10) Patent No.: US 9,437,595 B2
(45) Date of Patent: Sep. 6, 2016

(54) BARRIER TRENCH STRUCTURE AND METHODS OF MANUFACTURE

(71) Applicant: INTERNATIONAL BUSINESS MACHINES CORPORATION, Armonk, NY (US)

(72) Inventors: Brent A. Anderson, Jericho, VT (US); Andres Bryant, Burlington, VT (US); Edward J. Nowak, Essex Junction, VT (US); Jed H. Rankin, Richmond, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/686,972

(22) Filed: Apr. 15, 2015

(65) Prior Publication Data

US 2015/0221646 A1 Aug. 6, 2015

Related U.S. Application Data

(62) Division of application No. 13/108,144, filed on May 16, 2011, now Pat. No. 9,064,974.

(51) Int. Cl.
| | | |
|---|---|---|
| *H01L 27/092* | (2006.01) | |
| *H01L 21/762* | (2006.01) | |
| *H01L 21/84* | (2006.01) | |
| *H01L 27/12* | (2006.01) | |
| *H01L 21/8234* | (2006.01) | |
| *H01L 29/06* | (2006.01) | |

(52) U.S. Cl.
CPC ....... *H01L 27/092* (2013.01); *H01L 21/76283* (2013.01); *H01L 21/823481* (2013.01); *H01L 21/84* (2013.01); *H01L 27/1203* (2013.01); *H01L 29/0642* (2013.01)

(58) Field of Classification Search
CPC ........... H01L 23/556; H01L 21/76283; H01L 21/76286; H01L 29/0642; H01L 21/823481; H01L 27/092; H01L 27/1203; H01L 21/84; H03K 19/0033; H03K 19/00338
See application file for complete search history.

(56) References Cited

U.S. PATENT DOCUMENTS

| | | | |
|---|---|---|---|
| 4,937,756 A | 6/1990 | Hsu et al. | |
| 5,028,556 A | 7/1991 | Chang | |
| 5,032,529 A | 7/1991 | Beitman et al. | |
| 5,118,639 A * | 6/1992 | Roth ................... | H01L 29/0847 257/E21.433 |
| 5,429,958 A | 7/1995 | Matlock | |
| 5,554,568 A | 9/1996 | Wen | |
| 5,844,836 A | 12/1998 | Kepler et al. | |
| 6,057,188 A | 5/2000 | El-Kareh et al. | |
| 6,088,259 A | 7/2000 | Chi | |
| 6,091,630 A | 7/2000 | Chan et al. | |
| 6,111,780 A | 8/2000 | Bertin | |
| 6,140,674 A | 10/2000 | Hause et al. | |
| 6,218,895 B1 | 4/2001 | De et al. | |
| 6,255,194 B1 | 7/2001 | Hong | |

(Continued)

*Primary Examiner* — John P Dulka
(74) *Attorney, Agent, or Firm* — Michael LeStrange; Andrew M. Calderon; Roberts Mlotkowski Safran Cole & Calderon

(57) ABSTRACT

A structure includes at least one shallow trench isolation structure formed in a substrate to isolate adjacent different type devices. The structure further includes a barrier trench structure formed in the substrate to isolate diffusions of adjacent same type devices. The structure further includes a material spanning the barrier trench structure to connect the diffusions of the adjacent same type device, on a same level as the adjacent same type devices.

10 Claims, 4 Drawing Sheets

(56) References Cited

U.S. PATENT DOCUMENTS

| | | |
|---|---|---|
| 6,741,492 B2 | 5/2004 | Nii |
| 6,794,908 B2 | 9/2004 | Erstad |
| 7,298,010 B1 * | 11/2007 | Ma ................. H01L 23/556 |
| | | 257/357 |
| 7,649,216 B1 | 1/2010 | Clark et al. |
| 7,719,304 B1 | 5/2010 | Clark et al. |
| 2002/0140030 A1 | 10/2002 | Mandelman et al. |
| 2003/0116819 A1 | 6/2003 | Hokazono |
| 2006/0170044 A1 * | 8/2006 | Tu ...................... H01L 21/84 |
| | | 257/347 |
| 2007/0181972 A1 | 8/2007 | Voldman |
| 2007/0202639 A1 * | 8/2007 | Chidambarrao ........ H01L 21/84 |
| | | 438/164 |
| 2007/0275514 A1 * | 11/2007 | Itou ....................... H01L 21/743 |
| | | 438/151 |

* cited by examiner

BARRIER TRENCH STRUCTURE AND METHODS OF MANUFACTURE

FIELD OF THE INVENTION

The invention relates to semiconductor structures and methods of manufacture and, more particularly, to barrier trench structures and methods of manufacture.

BACKGROUND

Commercially available processors meet the performance and function requirements for many types of applications, but may not be sufficiently radiation hardened for certain other applications such as, for example, space applications. For example, commercial microelectronics have higher performance, function, and density compared with microelectronics designed for space applications; however, designs for such commercial microelectronics result in failure caused by Single Event Upsets (SEUs) in space applications. As is known by those of ordinary skill in the art, ionizing radiation in space (and ground) based applications directly upset storage circuits, such as SRAMs, register files and flip-flops, and can cause voltage latching glitches in combinational logic. Illustratively, SEUs may cause the circuit to perform incorrect or illegal operations such as, for example, flipping the state of a bi-stable circuit leading to complete device failure.

In space applications, the major radiation sources are high-energy protons and high-energy heavy ions (from helium up to about any heavy stable isotope). The high-energy cosmic protons and ions are known to produce secondary fragments which cause SEUs and single event latchups (SELs), as well as total failure resulting from total dose (long accumulation of radiation) in semiconductor ICs. For applications on the ground, a major source of radiation is from neutrons. These terrestrial neutrons interact with the devices and the packaging materials to produce secondary (spallation) ions that cause upsets (mainly single event upsets SEUs). The spectra of the secondary ions depend on the device back end of the line (BEOL) materials.

In current designs, the SEUs are prevented by the use of shallow trench isolation (STI) structures, which isolate and separate devices. Also, to ensure that the device does not completely fail, redundant transistors are also used. The redundancy is typically provided by electrically connecting transistors in series. However, electrically connecting transistors in series requires valuable chip space on multiple levels, in addition to complex processing steps. For example, the electrical connection between two electrical devices requires the fabrication of contacts and an upper wiring level. That is, in implementation, a dielectric layer has to be deposited over the electrical devices and patterned to form openings exposing their diffusions. A metal such as, for example, tungsten, is then deposited in the opening to form contacts with the diffusions. A metal wiring layer, on an upper layer, is then fabricated to connect the contacts. In all, these processing steps require added fabrication costs and require valuable chip space, which can otherwise be used for active components.

The STI structures may act as a barrier to minority carrier diffusion, but they typically are not dense enough due to the additional need of the contacts and wiring layer. Accordingly, there exists a need in the art to overcome the deficiencies and limitations described hereinabove.

SUMMARY

In a first aspect of the invention, a method comprises forming at least one shallow trench isolation structure in a substrate to isolate adjacent different type devices. The method further comprises forming a barrier trench structure in the substrate to isolate diffusions of adjacent same type devices. The method further comprises spanning the barrier trench structure with material to connect the diffusions of the adjacent same type device, on a same level as the adjacent same type devices.

In another aspect of the invention, a method comprises forming at least one shallow trench isolation structure in a substrate by etching into a film to form a trench and depositing an oxide material in the trench. The method further comprises forming a barrier trench structure in the substrate to isolate diffusions of adjacent same type devices comprising: etching into the film to form a barrier trench; depositing a gate dielectric and a gate electrode material on the film and within the barrier trench; and patterning the gate dielectric and the gate electrode material to form gate structures. The patterning leaves the gate dielectric and the gate electrode material within the trench. The method further comprises spanning the barrier trench structure with a spanning material on a same wiring layer as the adjacent same type devices.

In another aspect of the invention, a method comprising forming a P-well and an N-well in a silicon layer of a silicon-on-insulator substrate. The N-well and P-well are separated by trench isolation formed in the silicon layer and extending to a buried oxide layer. The method further comprises forming a trench in the N-well. The trench extends from the top surface of the silicon layer to the buried oxide layer. The method further comprises forming a gate dielectric layer on the top surface of the N-well and sidewall of the trench. The method further comprises forming a polysilicon layer on the gate dielectric layer. The polysilicon layer fills the trench. The method further comprises patterning the polysilicon layer to form a first gate electrode over the N-well on a first side of the trench, to form a second gate electrode over the N-well on a second side of the trench, and to form a third gate electrode over the P-well. The polysilicon is removed from over the trench, while the gate dielectric and the polysilicon layer remain in the trench which forms a dielectric lined and polysilicon filled trench. The method further comprises forming a first and second doped regions in the N-well on opposite sides of the first gate electrode. The method further comprises forming a third and fourth doped region in the N-well on opposite sides of the second gate electrode. The method further comprises forming a first and second doped regions in the P-well on opposite sides of the third gate electrode.

In yet another aspect of the invention, a structure comprises a PFET having a source and a drain formed in a silicon layer of silicon-on-insulator substrate which comprises a silicon layer on a buried oxide layer. The structure further comprises a first NFET having a source and a drain formed in the silicon layer of the silicon-on-insulator substrate. The structure further comprises a second NFET having a source and a drain formed in the silicon layer of the silicon-on-insulator substrate. The structure further comprises a dielectric lined and polysilicon filled trench extending from a top surface of the silicon layer to the buried oxide layer, and which physically isolates the source of the first NFET from the drain of the second NFET.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the a barrier trench structure, which comprises the structures of the present invention. In still further embodiments, a method in a computer-aided design system is provided for generating a functional design model of the barrier trench structure. The method comprises generating a functional representation of the structural elements of the barrier trench structure.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and methods of manufacture and, more particularly, to barrier trench structures and methods of manufacture. More specifically, the present invention is directed to a structure and/or device having one or more barrier trench structures lined with a dielectric material and filled with a poly material. The barrier trench structure of the present invention protects adjacent transistors of the structure from shorting or other transient events due to, for example, radiation events.

Advantageously, the barrier trench structure acts as a barrier to minority carrier diffusion, while eliminating the need for additional contacts and wiring layer and hence increasing usable chip space. More specifically, the present invention minimizes radiation induced events from occurring with minimal change to design and process changes. In this way, it is possible to use commercial components with commercial performance, function, and density with a minimal schedule delay, e.g., adds very little complexity to current processing methodologies. Thus, a new solution which meets the needs for performance and function and which also provides adequate radiation tolerance, at minimal cost and changes, is provided by the present invention.

Figure 1:
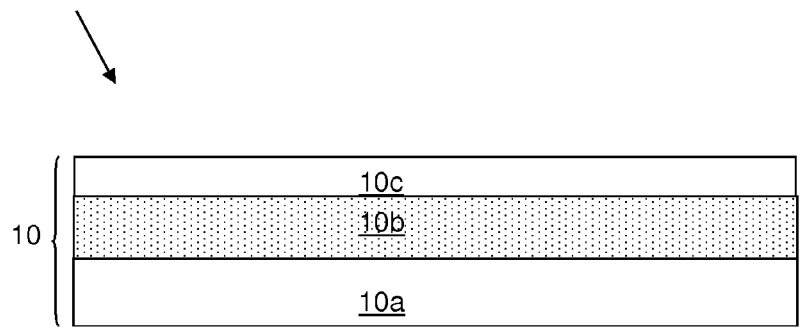
FIG. 1 shows a beginning structure in accordance with aspects of the present invention.

FIG. 1 shows a beginning structure in accordance with aspects of the present invention. More specifically, FIG. 1 shows a beginning structure 5 comprising a wafer 10. In embodiments, the wafer 10 can be a BULK wafer or a silicon on insulator (SOI) wafer. In SOI, for example, the wafer 10 can include a silicon substrate 10a, an insulator material 10b and a silicon film 10c. In embodiments, the insulator material 10b can be, for example, oxide such as, for example, silicon dioxide, or sapphire. The choice of insulator depends largely on the intended application, e.g., sapphire can be used for radiation-sensitive applications and silicon dioxide can be used for improved performance and diminished short channel effects in microelectronics devices.

Figure 2:
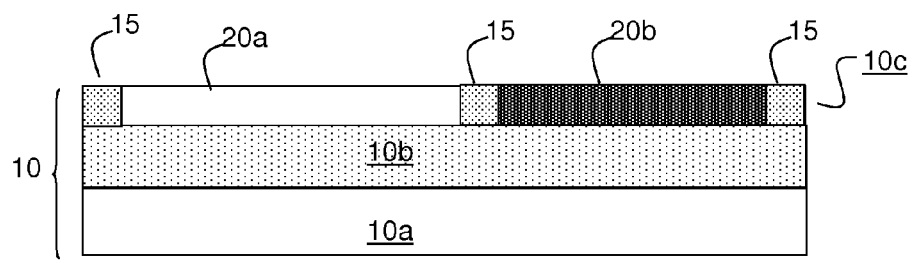
FIGS. 2-8 show processing steps and respective structures in accordance with aspects of the present invention.

FIG. 2 shows intermediate processing steps and a respective structure in accordance with aspects of the present invention. For example, in FIG. 2, shallow trench isolation (STI) structures 15 are formed in the structure 10 using conventional lithographic, etching and deposition processes. For example, in embodiments, a mask can be placed on the substrate 10, and exposed to light to form a pattern (openings). Trenches can then be formed in the substrate 10 using conventional etching processes such as, for example, reactive ion etching (RIE). In embodiments, the trenches will coincide with the openings of the resist. The trenches can then be filled with an oxide, for example, through conventional deposition methods such as, for example, chemical vapor deposition, to form the STI structures 15. In embodiments, the STI structures 15 extend to the insulator layer 10b, and are designed to separate NFET regions 20a and PFET regions 20b, e.g., N-well 20a and P-well 20b formed in the silicon layer 10c. Any remaining resist can then be stripped using conventional processes and, in embodiments, the structure can then undergo a chemical mechanical polishing (CMP).

Figure 3:
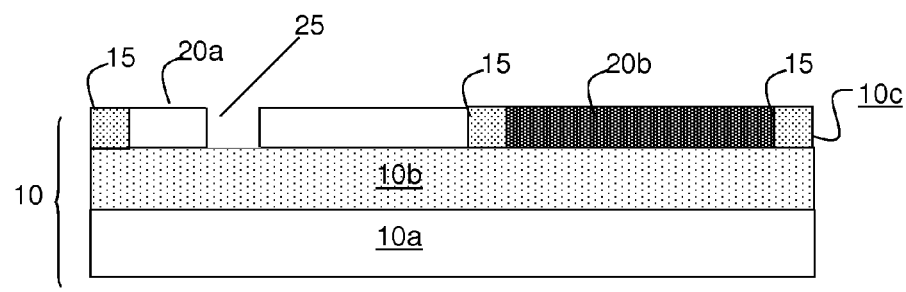

In FIG. 3, a trench 25 is formed, for example, in the NFET region 20a. In embodiments, the trench 25 can be similarly formed in a PFET region 20b, in accordance with aspects of the present invention. Although a single trench 25 is shown, it should be understood by those of skill in the art that a plurality of trenches 25 can be formed using the same processes as described herein.

In embodiments, the trench 25 can be formed using conventional lithographic and etching processes. For example, in embodiments, a mask can be placed on the substrate 10, and exposed to light to form a pattern (openings). The trench 25 can then be formed in the substrate 10 using conventional etching processes such as, for example, RIE. In embodiments, the trench 25 is a minimal image size, to ensure that a minimal amount of real estate (chip space) is used by the present invention. For example, the trench 25 may be about 32 nm in width for a 32 nm technology node; although trench sizes of 2 nm or more are contemplated by the present invention. In embodiments, the trench 25 is smaller than a trench used to form a barrier protection STI structure so that a strap, for example, can be fabricated at a device level, in order to connect adjacent devices. As discussed below, this will significantly decrease usage of valuable chip space, as well as reduce overall processing time and cost. In embodiments, the trench 25 extends to the insulator layer 10b.

Figure 4:
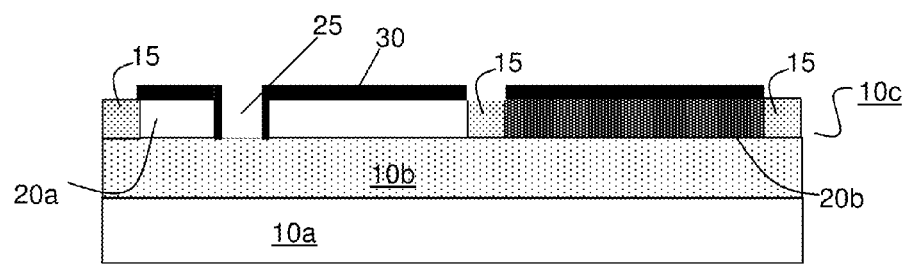

In FIG. 4, a gate dielectric 30 is formed on the substrate 10 and more particularly on the silicon film 10c and within the trench 25. In embodiments, the gate dielectric material 30 can be about 1 nm to 2 nm in thickness, but can be upwards of about less than 100 Å, depending on the technology node and required device performance. In embodiments, the gate dielectric 30 is an oxide material (e.g., silicon oxide, or silicon oxy nitride) formed using known processes. For example, the gate dielectric 30 can be grown from gaseous or liquid precursors using, e.g., vapor-phase epitaxy (VPE). In embodiments, the gate dielectric 30 can also be, for example, a high-k material, a hafnium based oxide, a silicon oxynitride, or other oxide or insulator material. In embodiments, the gate dielectric 30 is not grown on the STI structures 15.

Figure 5:
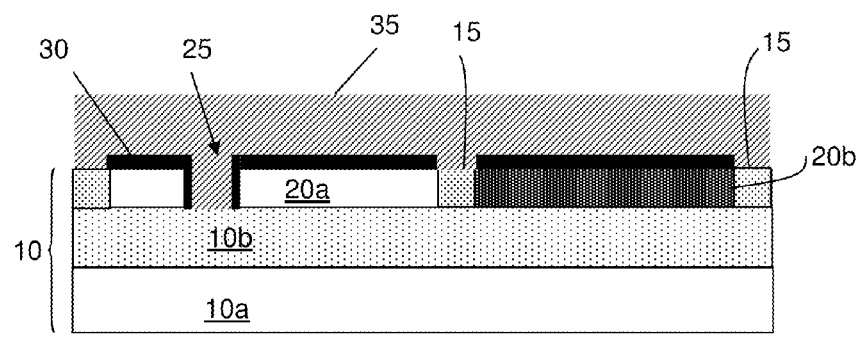

As further shown in FIG. 5, a gate electrode material 35 can be deposited on the gate dielectric 30. In embodiments, the gate electrode material 35 can be deposited using conventional deposition processes. For example, the gate electrode material 35 can be deposited using CVD, plasma enhanced CVD (PECVD) or atomic layer deposition (ALD). In embodiments, the gate electrode material 35 is poly material, deposited to a thickness of about 30 nm to about 150 nm, depending on the particular performance characteristics of the device. In further embodiments, the gate electrode material 35 can be a stack of material such as, for example, a metal alloy and a top layer of poly material. In still further embodiments, the gate electrode material 35 can be a metal alloy stack; although, in this implementation, the trench 25 should be as small as practical so that later processing steps can ensure bridging of Si grown material over the trench 25, e.g., the trench 25 can between about 2 nm to 10 nm in width.

In embodiments, the trench 25 should be sized to at least accommodate the gate dielectric 30 and the gate electrode material 35; although, in embodiments, the trench 25 should be sized to at least accommodate the gate dielectric 30. In the latter implementation, the trench 25 should be as small as practical so that later processing steps can ensure bridging of Si grown material over the trench 25, e.g., the trench 25 can between about 2 nm to 10 nm in width. As discussed above, in embodiments, the trench 25 is smaller than a trench used to form a barrier protection STI structure so that a strap, for example, can be fabricated at a device level, in order to connect adjacent devices.

Figure 6:
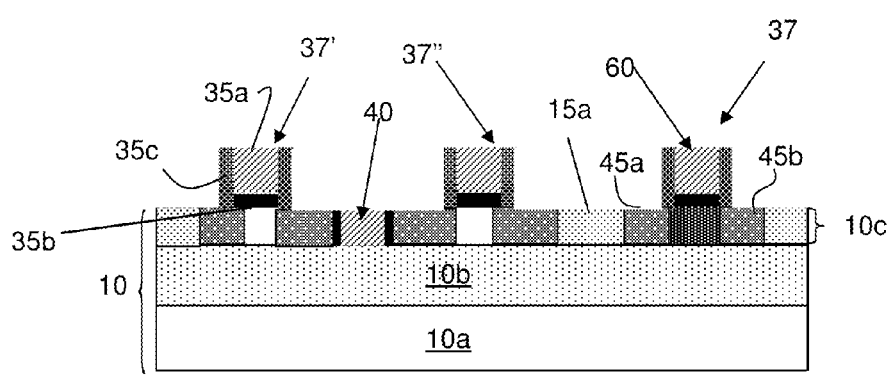

In FIG. 6, the gate dielectric 30 and the gate electrode material 35 are patterned to form gate stacks 37 and a barrier trench 40. The gate dielectric 30 and the gate electrode material 35 can be patterned using any conventional patterning process for CMOS manufacturing processes. The barrier trench 40, in embodiments, comprises a trench filled with dielectric material 30 and gate electrode material 35, for example. Also, the gate dielectric 30 and the gate electrode material 35 of the transistors, for example, are the same materials comprising the barrier trench 40. As should be understood by those of skill in the art, the barrier trench 40 will increase device immunity to radiation, for example, by blocking radiation events from passing from a diffusion of one device 37" (e.g., NFET) to a diffusion of another device 37' (e.g., NFET), while minimizing the use of chip space.

The gate stacks 37 can include, for example, a sidewall spacer 35c, deposited on the sidewalls of the patterned gate dielectric 35b and the gate electrode material 35a. The sidewall spacer 35c can be, for example, oxide or nitride. Diffusion regions 45a and 45b are formed in the substrate 10, and more particularly, in the Si film 10c. In embodiments, the diffusions 45a and 45b are source and drain regions, respectively, formed using conventional doping or implanting processes for N-type devices (37' and 37") and P-type device (60).

In embodiments, the STI structure 15a will separate (i.e., electrically isolate) the N-type device 37" and P-type device 60; whereas, the barrier trench 40 will isolate two devices, in series, e.g., N-type devices 37' and 37". That is, the STI structure 15a will physically isolate the diffusion region (e.g., drain) of the P-type device (PFET) 60 from the diffusion region (e.g., drain) of an N-type device (NFET) 37".

Figure 7:
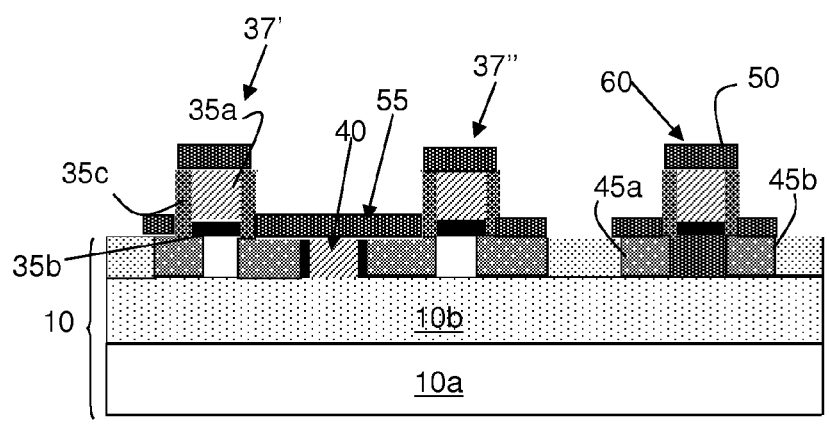

In FIG. 7, a material 50 is formed on the top surfaces of the gate stacks 37, as well as bridging (spanning) the barrier trench 40 to form a strap 55. In embodiments, the material 50 is advantageously formed on a same level as the devices 37', 37" and 60 and electrically connects, in series, same type devices, e.g., N-type devices 37' and 37". That is, the strap 55 extends (spans) over the barrier trench 40 and is connected to diffusion regions (e.g., top surfaces of source and drain regions) of respective devices 37' and 37". In embodiments, the strap 55 thus forms a redundant device system which, in turn, further increases device immunity to radiation, for example, while minimizing the use of chip space.

In embodiments, the material 50 is epitaxially grown Si having a thickness of about 32 nm or less and, more preferably about 20 nm, which extends over the trench 25 and contacts the diffusions of the respective devices. That is, due to the minimal size of the trench, it is possible to grow the epitaxially grown Si over the trench and in contact with the diffusions of the respective devices, which would not be possible with an oxide filled trench such as, for example, the STI structures 15 (or 15a) due to the material composition and/or dimensions. More specifically, the epitaxially grown Si grows on the diffusions and the poly material to span the dielectric material 30 in order to make a electrical connection between the diffusions of the same type devices 37' and 37". This eliminates the need for contacts and additional wiring levels, thereby freeing up valuable chip space.

It is possible to span the dielectric material 30 with the growth process due to the limited thickness of the dielectric material 30; however, this growth is not possible with an oxide filled trench such as, for example, the STI structures 15 (or 15a) due to the material composition and dimensions. In embodiments, the material 50 can be used as a raised source and drain.

In additional embodiments, the material 50 may be a metal silicide. The metal silicide may be formed using conventional annealing processes. Much like in the embodiment using the epitaxially grown Si, the metal silicide can form the strap 55 to serially connect the devices 37' and 37", on a same level as the devices, to form the redundant device. That is, the strap 55 extends over the barrier trench 40 and is connected to diffusion regions (e.g., top surfaces of source and drain regions) of respective devices 37' and 37". The silicide will not span over an oxide filled trench such as, for example, the STI structures 15 (or 15a) due to the material composition and/or dimensions.

Figure 8:
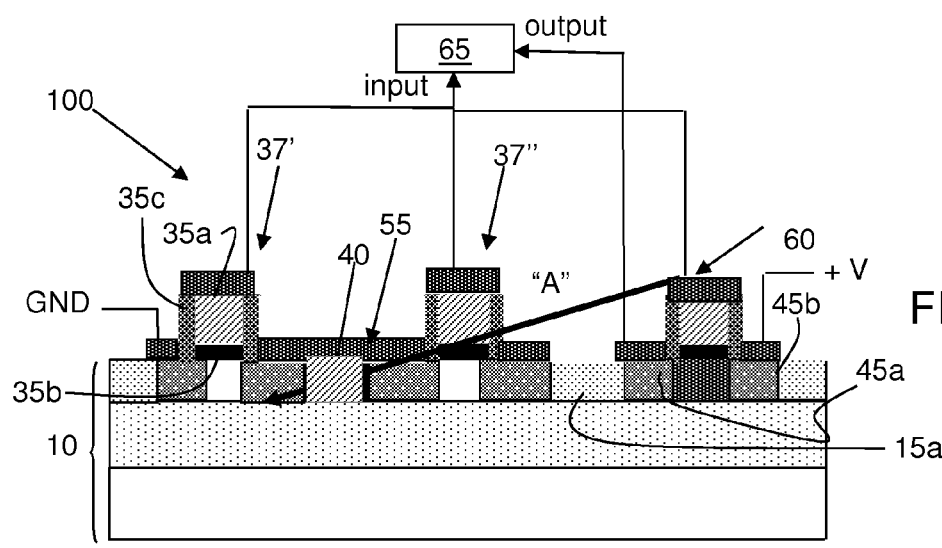

As shown in FIG. 8, for example, the structure 100 provides radiation immunity; that is, the structure of the present invention is designed in such a manner that radiation induced minority carriers that can disturb static and dynamic circuits with strong transients are prevented from flipping the state of a bi-stable circuit. More specifically, as depicted by the arrow "A", the barrier trench 40 will block radiation events, e.g., cut off a leakage path, from passing from a diffusion of one device 37" to a diffusion of another device 37' (even when a FET 37" Vt is reduced due to radiation event), while minimizing the use of chip space.

As further shown in FIG. 8, for example, a source of the PFET 60 is connected to a positive voltage supply, a drain of the PFET 60 can be connected to an output of an inverter 65. A source of the NFET 37" is connected to a drain of the NFET 37', and a source of the NFET 37' is connected to ground (GND). Also, the gates of the PFET 60 and NFETs 37' and 37" can be connected to an input of the inverter 65.

Figure 9:
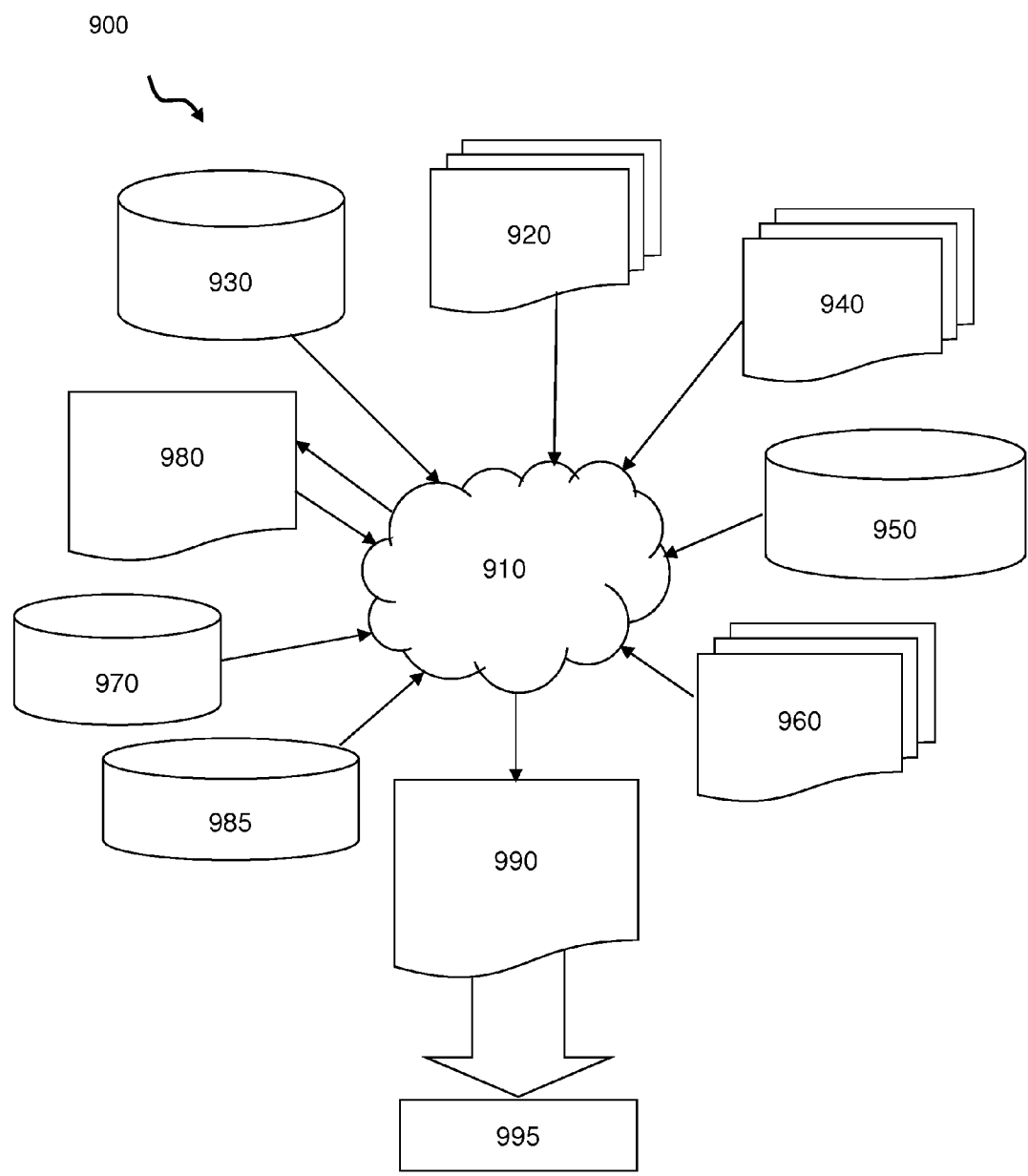
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by ALTERA® Inc. or XILINX® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure, comprising
   a PFET having a source and a drain formed in a silicon layer of silicon-on-insulator substrate which comprises the silicon layer on a buried oxide layer;
   a first NFET having a source and a drain formed in the silicon layer of the silicon-on-insulator substrate;
   a second NFET having a source and a drain formed in the silicon layer of the silicon-on-insulator substrate;
   a barrier trench structure lined with gate dielectric material and filled with gate polysilicon material which also forms the first NFET, the second NFET and the PFET, the barrier trench structure extending from a top surface of the silicon layer to the buried oxide layer, and physically isolates the source of the first NFET from the drain of the second NFET;
   a strap material extending on a surface of the barrier trench structure on a same level of the first NFET and the second NFET and spanning the barrier trench structure to electrically connect the source of the first NFET to the drain of the second NFET; and
   a shallow trench isolation structure in the silicon layer which electrically isolates the PFET and the first NFET, wherein the gate dielectric material and gate polysilicon material form a gate electrode material of the first NFET and the second NFET.

2. The structure of claim 1, wherein the strap material is an epitaxial silicon layer extending from a top surface of the source of the first NFET over the dielectric lined and polysilicon filled barrier trench structure to a top surface of the drain of the second NFET.

3. The structure of claim 1, wherein the strap material is a metal silicide layer formed on a top surface of the source of the first NFET, on a top surface of the drain of the second NFET and on a top surface of the gate polysilicon material, the metal silicide extending over the gate dielectric material.

4. The structure of claim 1, wherein the gate dielectric material is an oxide liner and is a same material as a gate dielectric layer of gates of the first and second NFETs and the gate polysilicon material is a same material as gate electrodes of the gates of the first and second NFETs.

5. The structure of claim 1, wherein the source of the PFET is connected to a positive voltage supply, the drain of the PFET connected to an output of an inverter, the source of the first NFET is connected to the drain of the second NFET, the source of the second NFET is connected to ground, and gates of the PFET and the first and second NFETs connected to an input of the inverter.

6. The structure of claim 1, wherein the barrier trench structure is structured to increase device immunity to radiation by blocking radiation events from passing between adjacent source/drain regions of the first NFET and the second NFET.

7. The structure of claim 1, wherein the strap material is formed on the same level as the first NFET and the second NFET and electrically connects, in series, the first NFET and the second NFET.

8. The structure of claim 1, wherein the strap material is epitaxially grown Si.

9. The structure of claim 8, wherein the strap material has a thickness of about 32 nm or less.

10. The structure of claim 1, wherein the strap material is a metal silicide.

* * * * *